United States Patent
Kameda et al.

(10) Patent No.: US 12,347,074 B2
(45) Date of Patent: Jul. 1, 2025

(54) PATTERN MEASUREMENT SYSTEM, PATTERN MEASUREMENT METHOD, AND PROGRAM FOR MEASURING EDGE ROUGHNESS AT THE EDGE OF A PATTERN BASED ON A RANDOM NOISE COMPONENT

(71) Applicant: Hitachi High-Tech Corporation, Tokyo (JP)

(72) Inventors: Toshimasa Kameda, Tokyo (JP); Kei Sakai, Tokyo (JP); Junichi Kakuta, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 372 days.

(21) Appl. No.: 17/643,203

(22) Filed: Dec. 8, 2021

(65) Prior Publication Data

US 2022/0230281 A1    Jul. 21, 2022

(30) Foreign Application Priority Data

Jan. 21, 2021 (JP) .................................. 2021-008075

(51) Int. Cl.
*G06T 5/70*       (2024.01)
*G01B 11/30*    (2006.01)
(Continued)

(52) U.S. Cl.
CPC ................ *G06T 5/70* (2024.01); *G01B 11/30* (2013.01); *G01B 15/08* (2013.01);
(Continued)

(58) Field of Classification Search
CPC ............. G06T 5/70; G06T 2207/10061; G06T 2207/20072; G06T 2207/20192;
(Continued)

(56) References Cited

U.S. PATENT DOCUMENTS

| | | | |
|---|---|---|---|
| 2003/0021463 A1 | 1/2003 | Yamaguchi et al. | |
| 2015/0227061 A1* | 8/2015 | Tinnemans | G03F 9/7069 356/509 |

(Continued)

FOREIGN PATENT DOCUMENTS

| | | |
|---|---|---|
| JP | 3870044 B2 | 1/2007 |
| JP | 2019-39884 A | 3/2019 |

*Primary Examiner* — Nay A Maung
*Assistant Examiner* — Heath E. Wells
(74) *Attorney, Agent, or Firm* — Crowell & Moring LLP

(57) ABSTRACT

Proposed is a technique that can detect a random noise component at high accuracy without measurement pattern limitation and enables edge roughness measurement at higher accuracy. According to this disclosure, pattern matching and edge position correction are performed with respect to each of the left edge and the right edge of a line pattern in an obtained line pattern image, and an image with no roughness is generated. A PSD value is measured from the image, and the average PSD value of all the frequencies is determined as a random noise component, so that the random noise component can be detected at high accuracy. Further, the PSD value (random noise component) is subtracted from the PSD value of an original image, thereby measuring edge roughness at high accuracy.

12 Claims, 10 Drawing Sheets

(51) Int. Cl.
  *G01B 15/08* (2006.01)
  *G06V 10/75* (2022.01)
(52) U.S. Cl.
  CPC ............... *G06V 10/7515* (2022.01); *G06T 2207/10061* (2013.01); *G06T 2207/20072* (2013.01); *G06T 2207/20192* (2013.01); *G06T 2207/30148* (2013.01); *G06T 2207/30168* (2013.01)
(58) Field of Classification Search
  CPC . G06T 2207/30148; G06T 2207/30168; G06T 2207/20056; G06T 7/0004; G01B 11/30; G01B 15/08; G01B 2210/56; G06V 10/7515; G06V 10/30; G06V 10/457; G06V 2201/06; G03F 7/70625; H01L 22/12; H01L 22/20; H01L 22/24; H01L 22/26; G01N 21/95684; G01N 21/8851; G01N 21/95607; G01N 23/2251; G01N 2021/95615; G01N 2201/127
  USPC .......................................................... 382/108
  See application file for complete search history.

(56) References Cited

U.S. PATENT DOCUMENTS

| | | | |
|---|---|---|---|
| 2018/0364036 A1* | 12/2018 | Jak | G01B 15/08 |
| 2019/0066973 A1 | 2/2019 | Kawada et al. | |
| 2019/0113338 A1* | 4/2019 | Mack | G03F 7/70616 |
| 2019/0120777 A1* | 4/2019 | Fukuda | G01N 23/2251 |
| 2021/0142977 A1* | 5/2021 | Mack | G06T 7/40 |

* cited by examiner

SUM LINE PROFILE

PATTERN MEASUREMENT SYSTEM, PATTERN MEASUREMENT METHOD, AND PROGRAM FOR MEASURING EDGE ROUGHNESS AT THE EDGE OF A PATTERN BASED ON A RANDOM NOISE COMPONENT

TECHNICAL FIELD

This disclosure relates to a pattern measurement system, a pattern measurement method, and a program.

BACKGROUND ART

In the microfabrication process of a semiconductor manufacturing process, the edge roughness of a pattern (the unevenness of a pattern end portion) has a great influence on the yield of a device. It has been found that the occurrence degree of the edge roughness largely varies according to a material constituting a semiconductor device, an exposure device, the properties and characteristics of a ground substrate, or the like. In recent years, with microfabricated patterns, edge roughness measurement has been required to have higher accuracy. In the edge roughness measurement, when there are many random noises in an image to be measured, the edge of a pattern cannot be precisely captured, so that edge roughness larger than true edge roughness is measured. Consequently, for the high accuracy edge roughness measurement, the detection and removal the random noise component of the image are effective.

For example, Patent Literature 1 discloses a measurement method by which the edge roughness of each of left and right sides of a line pattern is calculated as a 3σ value indicating the width of unevenness fluctuation on the basis of an ideal straight line. Also, Patent Literature 1 describes a method by which an edge shape is analyzed by performing the Fourier analysis on a set of fluctuation data and calculating an intensity with respect to a spatial frequency. Further, Patent Literature 2 describes a method by which a random noise component is detected from the PSD (Power Spectrum Density) value of a line pattern.

CITATION LIST

Patent Literature

Patent Literature 1: Patent No. 3870044
Patent Literature 2: Japanese Unexamined Patent Application Publication No. 2019-39884

SUMMARY OF INVENTION

Technical Problem

As described above, for the high accuracy edge roughness measurement, it is effective to detect and remove the random noise component of an image.

However, since in the method in Patent Literature 2, the random noise amount is estimated from only the high frequency component, the PSD value may not be sufficiently converged in the high frequency portion. In this case, there are many errors in the approximate straight line of the PSD value, and thus, the detection accuracy of the noise component is lowered. In particular, when the number of line patterns in the screen is small or the line is short, the detection accuracy of the noise is lowered. Consequently, to improve the detection accuracy, it is necessary to increase the number of patterns (measurement pattern limitation), but when the number of patterns is increased, the processing becomes complicated, so that the efficiency becomes low.

In view of such circumstances, this disclosure proposes a technique by which a random noise component can be detected at high accuracy without measurement pattern limitation, and edge roughness measurement is enabled at higher accuracy.

Solution to Problem

To solve the above problems, this disclosure proposes a pattern measurement system that uses a signal obtained by charged particle beam scan or light irradiation with respect to a sample to measure a pattern formed on the sample, the system including a storage device that stores a program for processing the information of the pattern, and a computer that reads the program from the storage device and processes the information of the pattern, in which the computer executes a process for generating a plurality of individual line profiles, a sum line profile of the plurality of line profiles, and an original image of the pattern on the basis of the signal obtained from the pattern, a process for dividing each of the plurality of individual line profiles into two regions, a process for executing, for each of the plurality of individual line profiles each divided into the two regions and the sum line profile, pattern matching between each of the individual line profiles and the sum line profile, a process for executing position correction with respect to each of the plurality of individual line profiles on the basis of the result of the pattern matching, a process for generating a correction image of the pattern from the plurality of line profiles that have been position corrected, a process for calculating power spectrum density at the edge of the pattern in the correction image and averaging the power spectrum density to calculate a random noise component, and a process for calculating edge roughness by taking the difference between power spectrum density at the edge of the pattern in the original image and the random noise component.

Further features related to this disclosure will be apparent from the description and accompanying drawings of this specification. Also, the aspects of this disclosure can be achieved and realized by the forms of elements, the combinations of various elements, the following detailed description, and the attached claims.

It is necessary to understand that the description of this specification is merely typical illustration, and does not limit the claims or the application examples of this disclosure in any sense.

Advantageous Effects of Invention

According to the technique of this disclosure, it is possible to detect a random noise component at high accuracy without measurement pattern limitation and measure edge roughness at higher accuracy.

DESCRIPTION OF EMBODIMENTS

Figure 1:
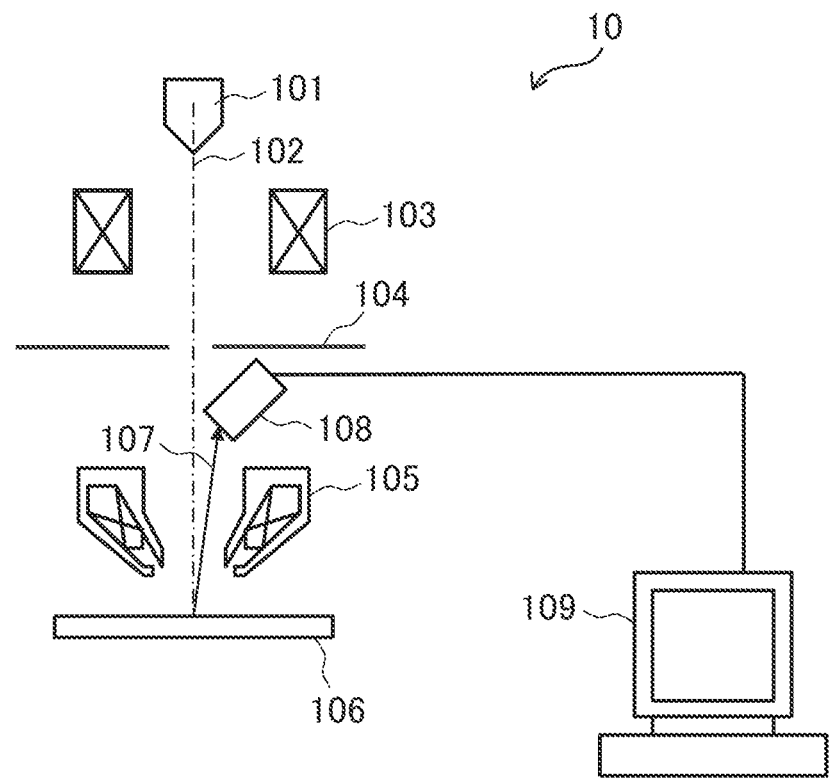
FIG. 1 is a diagram illustrating a schematic configuration example of a CD-SEM according to this embodiment.

This embodiment proposes a pattern measurement method and a pattern measurement system (apparatus) for measuring true edge roughness appearing at the edge of a pattern at higher accuracy by detecting a noise component at high accuracy from an image to be measured.

In recent years, with microfabricated patterns, the edge roughness of a pattern (the unevenness of a pattern end portion) has been required to be measured at high accuracy. This is because it has been found that the occurrence degree of the edge roughness largely varies according to a material constituting a semiconductor device, an exposure device, properties and characteristics of a ground substrate, or the like, and the measurement and control of the edge roughness have a great influence on the yield of a device.

However, for example, when the pattern is imaged by a semiconductor measurement apparatus, such as a scanning electron microscope (Critical Dimension SEM: CD-SEM), noise randomly occurring in terms of time (random noise) caused from a detector or from an electronic circuit while a signal of the detector is converted to an electric signal is overlapped. Consequently, due to the random noise, the edge of the pattern cannot be accurately captured. This outputs, in the edge roughness measurement, a roughness value larger than true edge roughness that the pattern itself has.

Accordingly, it is necessary to detect the random noise present on the image at high accuracy and remove the random noise for measuring the edge roughness. There are a semiconductor pattern measurement method by light irradiation and a semiconductor pattern measurement method by charged particle beam irradiation, but both are different in resolution, and perform a digital signal process for pattern imaging. Therefore, the same image process can be used.

Hereinafter, an embodiment of this disclosure will be described with reference to the accompanying drawings by taking an image obtained by the CD-SEM as an example. In the accompanying drawings, elements that are the same in function are sometimes denoted by the same numbers. Note that the accompanying drawings illustrate the specific embodiment and implementation examples along the principle of this disclosure, but these are for understanding this disclosure, and are never used for limitedly understanding this disclosure.

In this embodiment, the description thereof is sufficiently made in detail in order for those skilled in the art to perform this disclosure, but it is necessary to understand that other implementation and forms are enabled, and that the change in configuration and structure and the replacement of various elements can be made without departing from the scope and spirit of the technical idea of this disclosure. Therefore, the following description should not be understood by being limited to this.

Further, as described later, the embodiment of this disclosure may be implemented by software operated on a general-purpose computer, or may be implemented by exclusive hardware or a combination of software and hardware.

<A Configuration Example of the CD-SEM>

FIG. 1 is a diagram illustrating a schematic configuration example of the CD-SEM according to this embodiment. A CD-SEM 10 includes an electron gun 101, a condenser lens 103, a diaphragm 104, an objective lens 105, a detector 108, and an image conversion unit 109.

The electron gun 101 draws out a primary beam 102 from an electron source, and accelerates the primary beam 102 to acceleration voltage set by the user. Thereafter, the irradiation of the primary beam 102 is performed onto a sample 106 through the condenser lens 103, the diaphragm 104, and the objective lens 105. Discharge electrons 107 are discharged from the sample 106 depending on the energy, sample potential, unevenness, and the like at the time of irradiation. The discharge electrons 107 are detected by the detector 108. The detected signal is converted to an electric signal, is inputted to the image conversion unit 109, and is converted to an image.

<A Configuration Example of the Image Conversion Unit>

Figure 2:
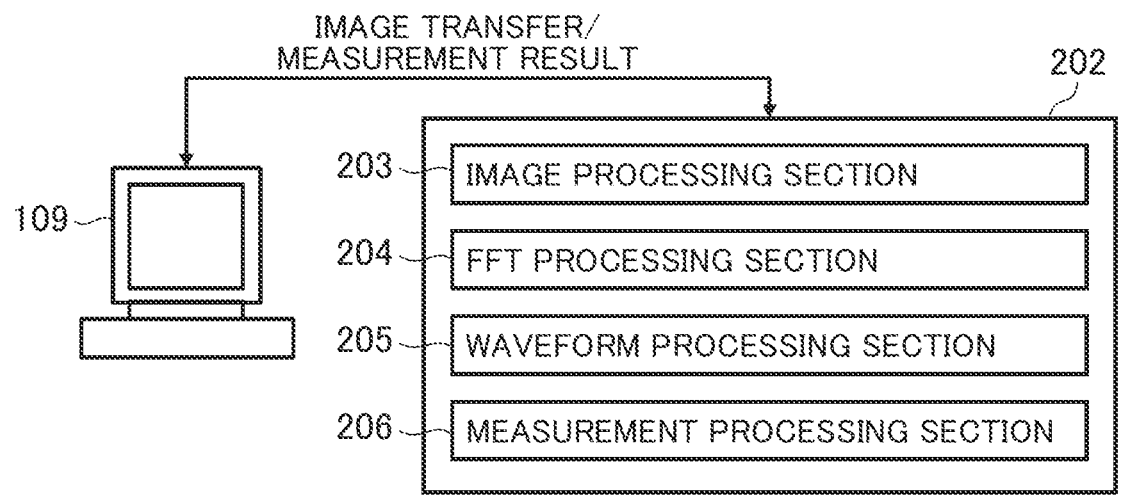
FIG. 2 is a diagram illustrating a configuration example of a system including an image conversion unit 109 and a pattern measurement unit 202 that measures a pattern with respect to an image obtained therein.

FIG. 2 is a diagram illustrating a configuration example of a system including the image conversion unit 109 and a pattern measurement unit 202 that measures a pattern with respect to an image obtained therein. Note that although FIG. 2 illustrates the configuration in which the image conversion unit 109 and the pattern measurement unit 202 are connected by a network, the present invention is not limited to this, and pattern measurement described later may be performed in the image conversion unit 109.

The pattern measurement unit 202 illustrated in FIG. 2 includes an image processing section 203 that receives an image obtained from the image conversion unit 109 and performs line profile calculation and an image process as described later, an FFT processing section 204 that detects an edge from the obtained image and calculates power spectrum density (PSD) by performing the Fourier analysis, a waveform processing section 205 that measures a random noise amount by a method as described later from a PSD curve generated by the FFT processing section 204, and a measurement processing section 206 that calculates a true edge roughness amount by using the random noise amount obtained from the waveform processing section 205 and outputs the result on the display of the image conversion unit 109. For example, the pattern measurement unit 202 can be configured of a computer including, as components, a storage device and a processer. In this case, the processor reads various programs for realizing the image processing section 203, the FFT processing section 204, the waveform processing section 205, and the measurement processing section 206 from the storage device, and develops the programs to the internal memory (not illustrated) of the processor, thereby enabling each unit and each section to be configured.

<The Detail of the Image Process and the True Edge Roughness Measurement Process>

Figure 3:
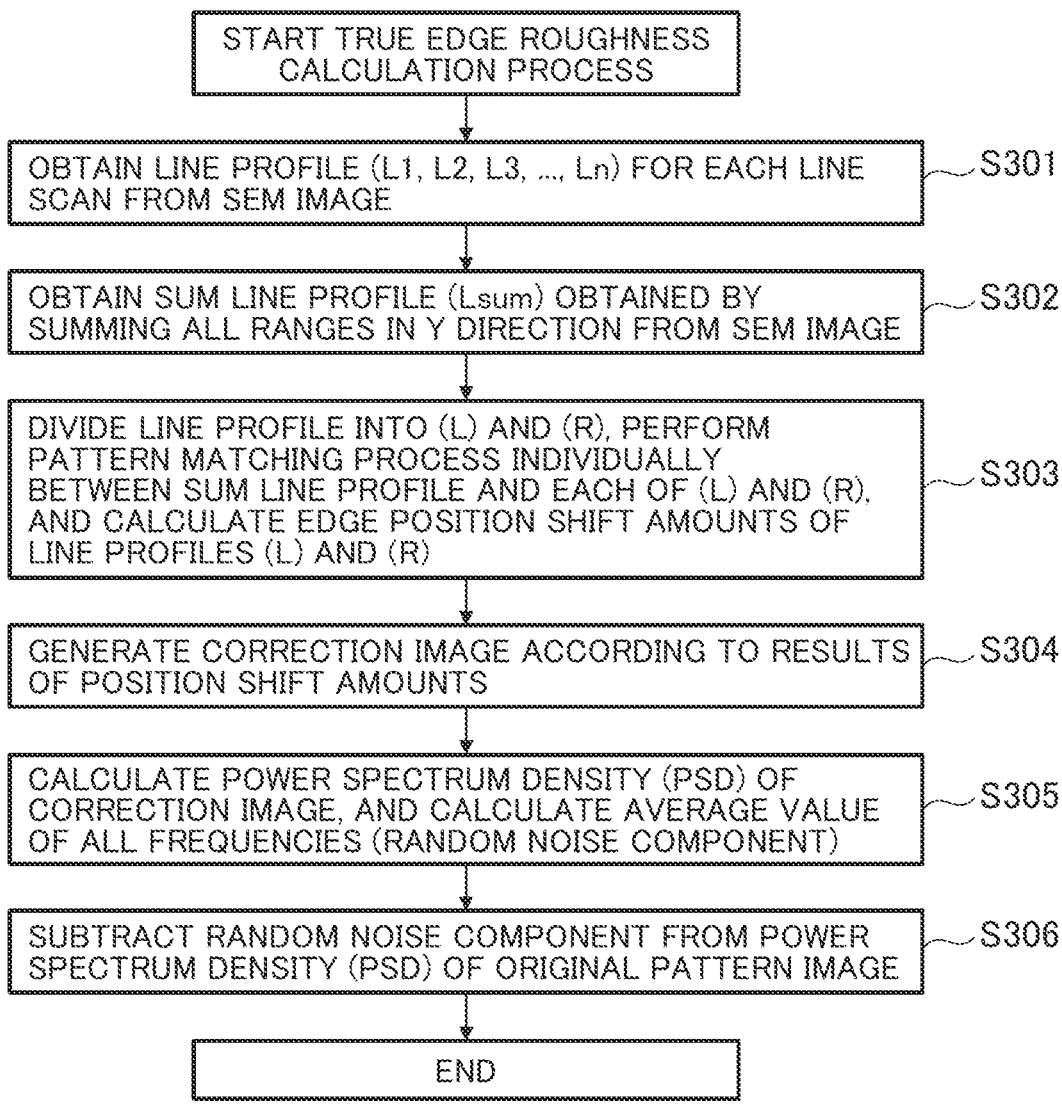
FIG. 3 is a flowchart for explaining an image process and a true edge roughness measurement process of the pattern measurement unit 202.

FIG. 3 is a flowchart for explaining the image process and the true edge roughness measurement process of the pattern measurement unit 202. Hereinafter, the operation main body of each step is each processing section (such as the image processing section 203), but each processing section is realized by the processor of the pattern measurement unit 202, so that the operation main body can also be the processor or the pattern measurement unit 202.

(i) Step 301

Figure 4:
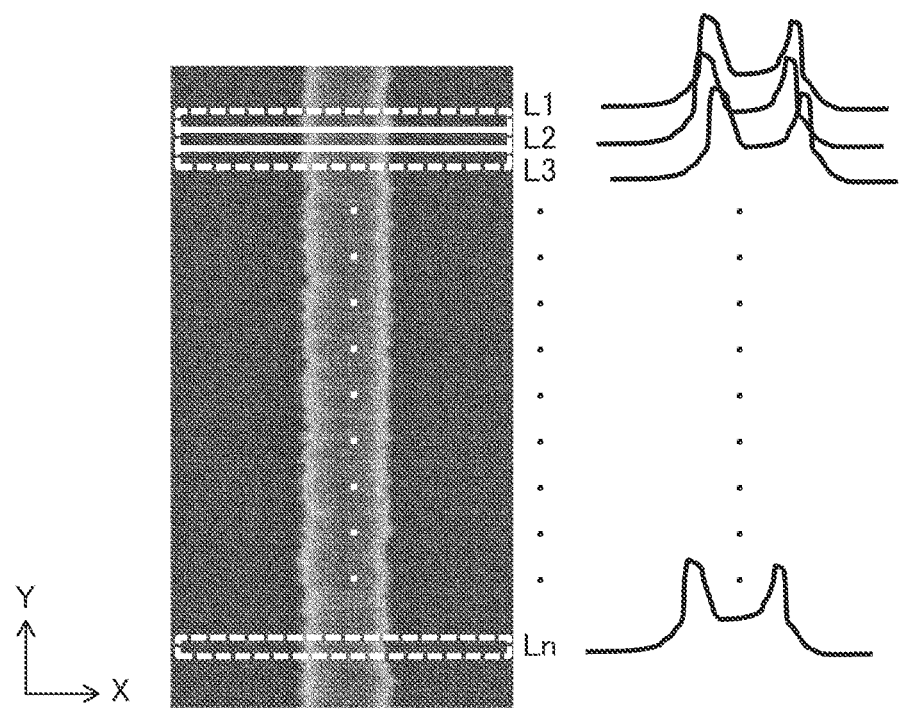
FIG. 4 illustrates a profile obtained for each line scan.

First, the image processing section 203 captures an SEM imaged image including at least one or more line patterns from the image conversion unit 109. Then, as illustrated in FIG. 4, the image processing section 203 obtains a line profile for each line scan from the SEM image. Here, FIG. 4 illustrates the profile obtained for each line scan. For example, in FIG. 4, when the range in the Y direction is 256 pix, 256 line profiles are obtained.

(ii) Step 302

Figure 5:
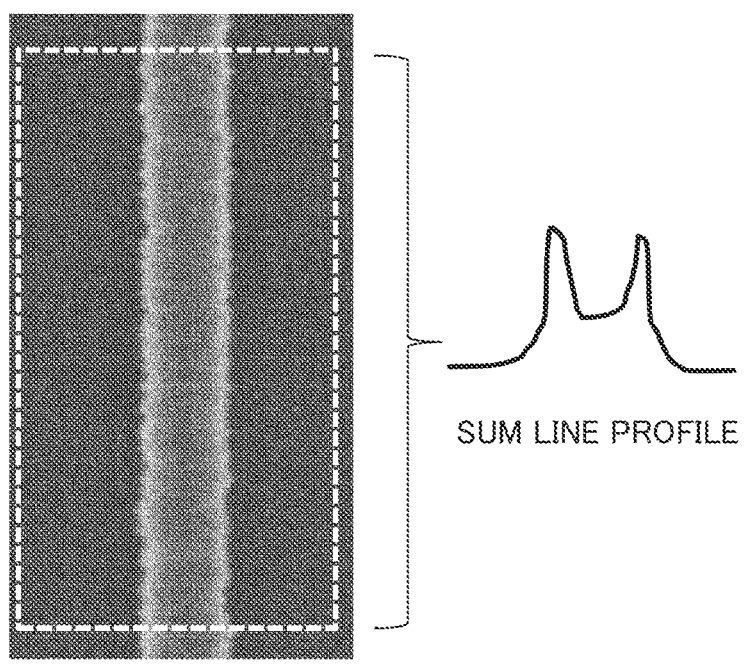
FIG. 5 is a diagram illustrating an example of a SUM line profile calculated and obtained from line profiles in all the ranges (for example, an average value obtained by performing the summation of the line profiles in all the ranges and dividing the result of the summation by the number of lines)

As illustrated in FIG. 5, the image processing section 203 obtains a SUM line profile obtained by summing all the ranges designated in the Y direction from the SEM image. FIG. 5 illustrates an example of the SUM line profile calculated and obtained from the line profiles in all the ranges (for example, an average value obtained by performing the summation of the line profiles in all the ranges and dividing the result of the summation by the number of lines).

(iii) Step 303

Figure 6:
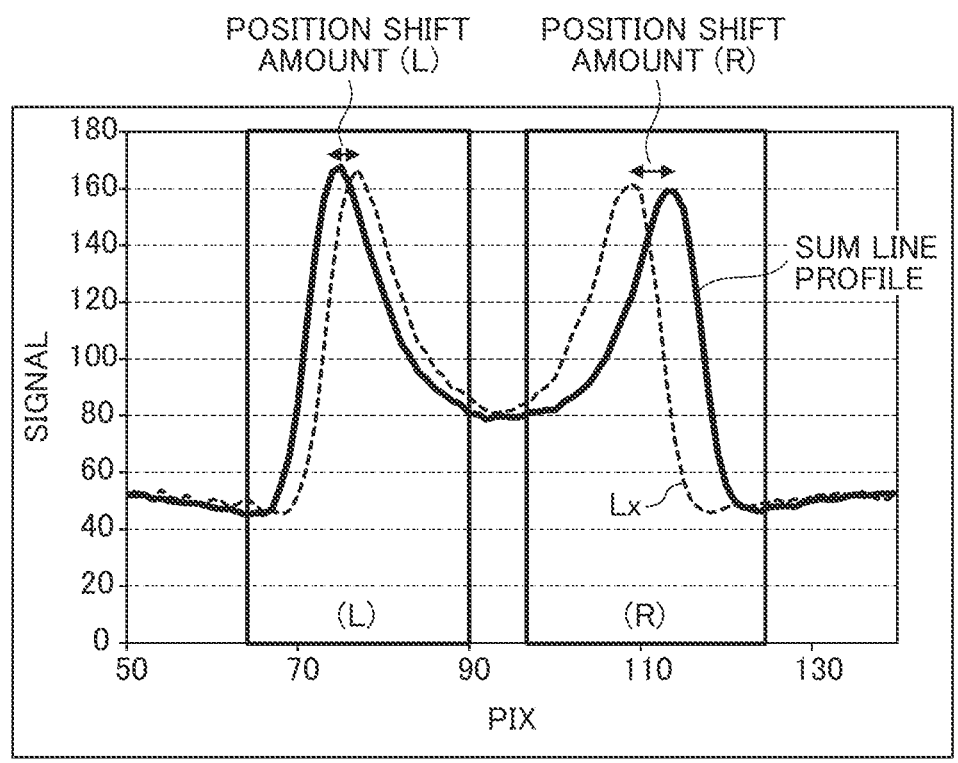
FIG. 6 is a graph illustrating an example of the position shift amount between the SUM line profile and each line profile.

The image processing section 203 divides, in the line profiles obtained in step 301, each line profile into the left and right sides (L and R), performs pattern matching between each line profile and the SUM line profile obtained in step 302 at each line edge, and as illustrated in FIG. 6, obtains a position shift amount. FIG. 6 illustrates an example of the position shift amount between the SUM line profile and each line profile.

(iv) Step 304

Figure 7:
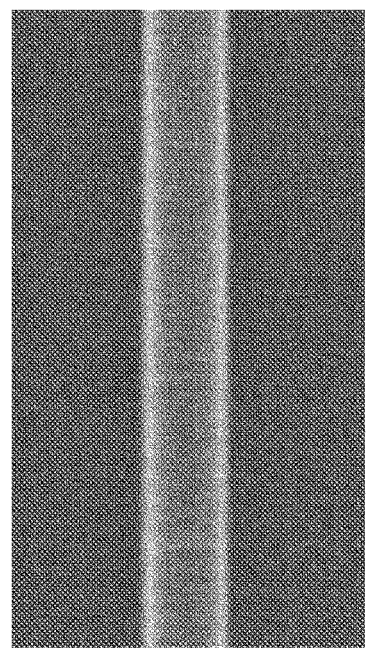
FIG. 7 is a diagram illustrating an example of an image from which a roughness component is removed.

The image processing section 203 performs the position shift correction (image process) of the SEM image from the position shift amount obtained in step 303, and as illustrated in FIG. 7, generates an image from which a roughness component is removed. FIG. 7 illustrates an example of the image from which the roughness component is removed.

(v) Step 305

The FFT processing section 204 performs power spectrum density (PSD) measurement with respect to the SEM image obtained in step 304, calculates an average value (PSD Ave.) of all the frequencies of the obtained PSD values, and determines the average value as a random noise component.

(vi) Step 306

The waveform processing section 205 measures true edge roughness by subtracting the random noise component obtained in step 305 from the PSD value of an original image. Note that the measurement processing section 206 can receive the measured edge roughness from the waveform processing section 205, and display the measured edge roughness on the display of the image conversion unit 109.

Figure 8:
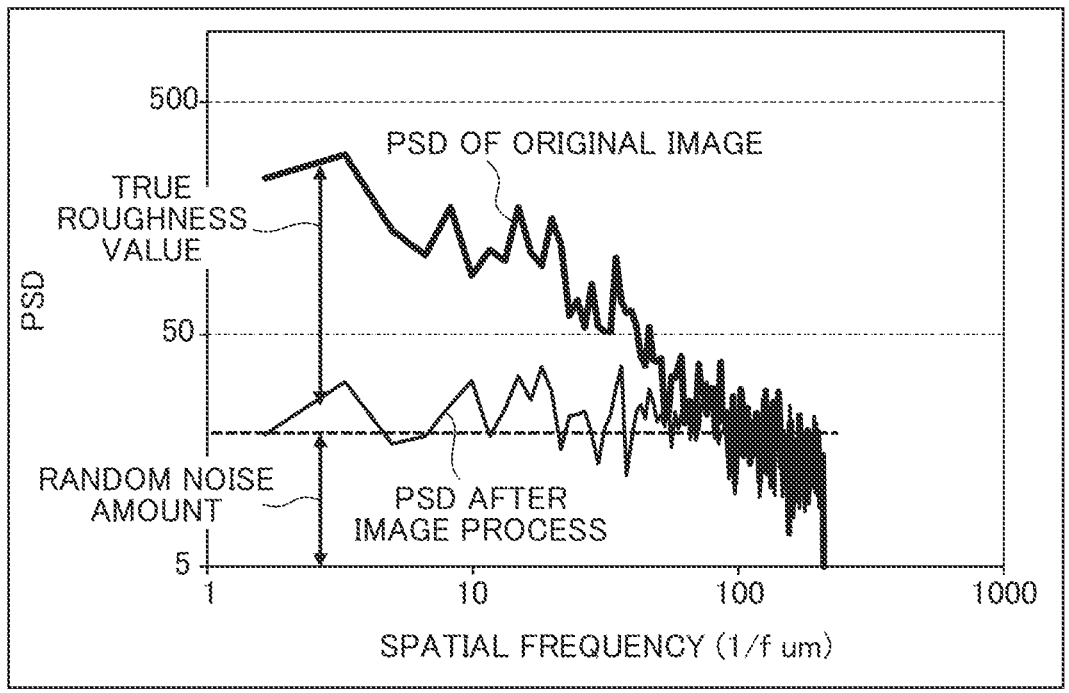
FIG. 8 is a graph illustrating a state where the PSD value (the PSD value with respect to a spatial frequency) of an original image and the PSD value (the PSD value with respect to a spatial frequency) after the image process calculated in step 305 are compared.

FIG. 8 is a graph illustrating a state where the PSD value (the PSD value with respect to a spatial frequency) of the original image and the PSD value (the PSD value with respect to a spatial frequency) after the image process calculated in step 305 are compared.

As illustrated in FIG. 8, since the PSD value after the image process is subjected to the pattern edge position correction, only the random noise component appears in the PSD obtained from here. Also, since it has been found that typically, the random noise is uniformly present in the band of all the frequencies, the variation in the random noise component can be reduced by determining the average value of all the frequencies as the random noise component. Then, the random noise component obtained from this method is subtracted from the PSD value of the original image, so that the true edge roughness can be calculated at high accuracy. Also, when there are a plurality of line patterns in the image, the above process may be performed by each line pattern to calculate the random noise component, thereby subtracting the averaged value from the PSD value of the original image.

As described above, the image from which the roughness component is removed is generated, and the average PSD value of all the frequencies is determined as the random noise component, so that the high accuracy noise component detection is enabled, and the high accuracy roughness measurement is enabled. Also, in this method, there is no limitation to the pattern used for measurement.

<A Process for Deciding the Optimum Number of Imaging Frames>

Here, a method for deciding the optimum number of imaging frames by using a noise amount detected at high accuracy will be described. The CD-SEM 10 performs the summation of the certain decided number of images (the number of frames) obtained by scanning the same location several times at the time of image generation, and then performs measurement (This is ditto for the roughness measurement process described above.). At this time, as the number of frames is increased, the random noise becomes relatively smaller, so that the measurement becomes stable.

However, when the number of frames is increased, the image obtaining time is increased according to that, and damage due to the electron beam irradiation onto the sample and the shrink of the pattern in the case that the sample is a resist sample occur. On the other hand, when the number of frames is subjected to addition, the random noise amount is saturated to some degree at the certain number of frames.

Accordingly, here, a process for calculating the minimum number of frames (the optimum number of frames) in which the random noise amount is saturated is proposed.

Figure 9:
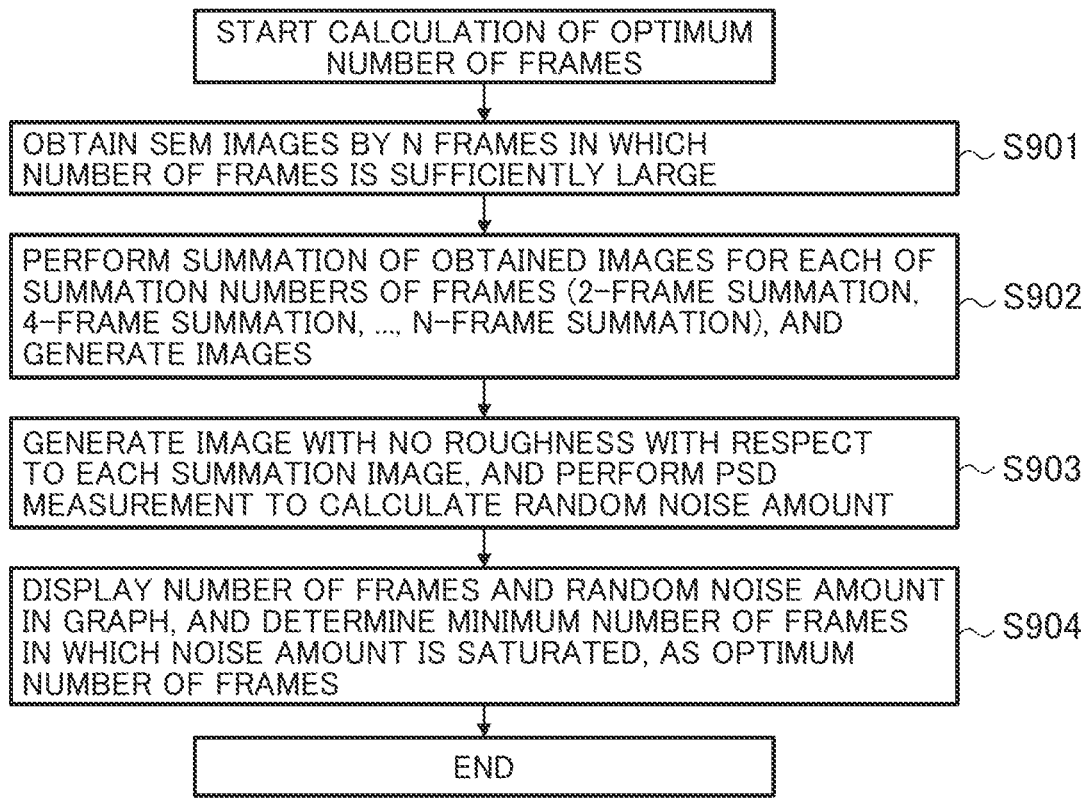
FIG. 9 is a flowchart for explaining a process for calculating the optimum number of frames.

FIG. 9 is a flowchart for explaining the process for calculating the optimum number of frames.

(i) Step 901

The image processing section 203 obtains SEM images by a sufficiently large number of frames to the extent that random noise is saturated to some degree (the previously set number of frames: for example, 32 frames).

(ii) Step 902

Figure 10:
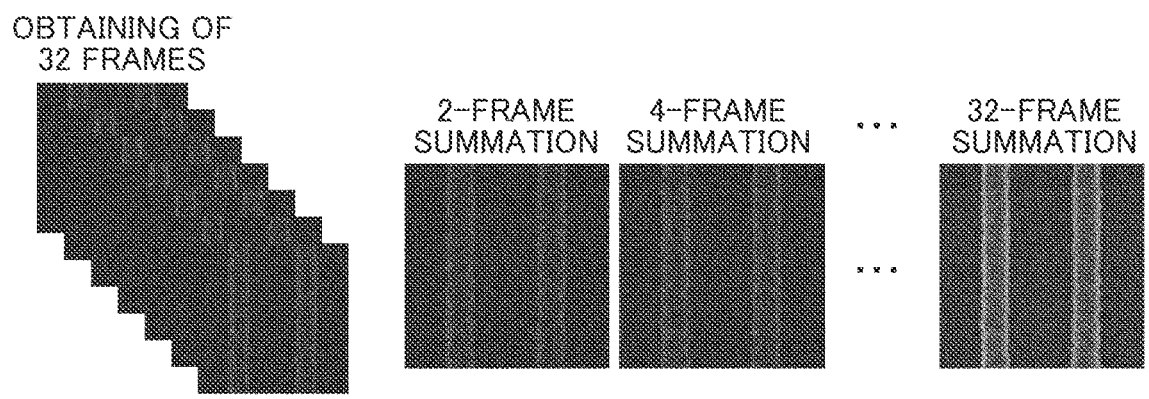
FIG. 10 is a diagram illustrating summation images (examples) generated by 2-frame summation to 32-frame summation.

As illustrated in FIG. 10, the image processing section 203 generates summation images for 2-frame summation, 4-frame summation, 8-frame summation, 16-frame summation, and 32-frame summation. At this time, the summation number of frames is not decided, and any summation number of frames is used.

(iii) Step 903

The image processing section 203 executes step 301 to step 304 in FIG. 3 with respect to each summation image to generate an image with no roughness. Also, the FFT processing section 204 executes step 305 in FIG. 3, and measures a PSD to calculate a random noise amount.

(iv) Step 904

Figure 11:
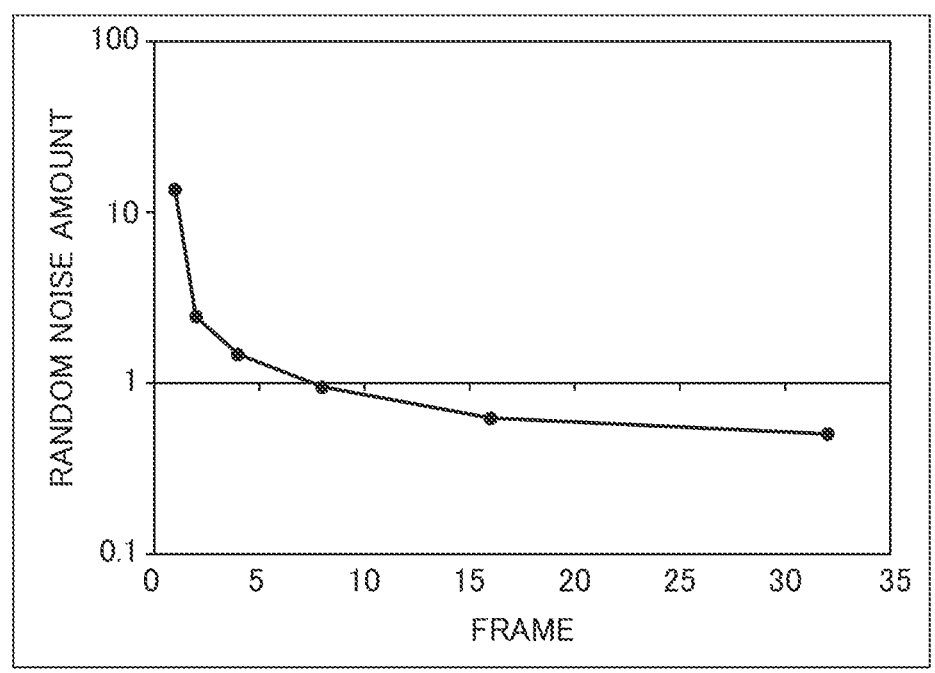
FIG. 11 is a graph illustrating the relationship between the number of frames and a random noise amount.

The waveform processing section 205 generates and displays a graph that illustrates the relationship between the number of frames and the random noise amount, and determines the minimum number of frames in which the noise amount is saturated, as the optimum number of frames. Note that FIG. 11 is a graph illustrating the relationship between the number of frames and the random noise amount. Whether or not the noise amount is saturated can be determined depending on whether or not an inclination in the graph illustrated in FIG. 11 becomes a predetermined value or less (When the inclination becomes the predetermined value or less, it is determined that the noise amount is saturated.). In FIG. 11, the random noise amount is saturated for 16 frames (It can be determined that the inclination in the graph becomes the predetermined value or less.), so that the 16 frames are decided as optimum frames.

As described above, the random noise amount is plotted while the number of frames is changed, so that the optimum number of frames can be decided.

<A Process for Deciding an Optimum Smoothening Coefficient>

Here, a process for deciding an optimum smoothening coefficient at the time of measurement by using a noise amount detected at high accuracy will be described. As described above, to perform the edge roughness measurement, it is necessary to detect the edge position of a pattern from a line profile obtained from an image. At this time, the line profile is subjected to a smoothening process by any number of pixels in the X direction or the Y direction, so that the random noise component can be reduced from the line profile, and the edge can be stably detected and measured.

However, when the number of pixels used for the smoothening process (smoothening coefficients) is large (there are many pixels), the pattern edge is quite different from the shape of the actual pattern edge (When the smoothening coefficient is too large, the shape of the pattern edge becomes dull.), and the edge roughness of the pattern is lost.

Accordingly, here, a process for calculating the optimum smoothening coefficient that can reduce the random noise component and hold the edge information of the pattern is proposed.

Figure 12:
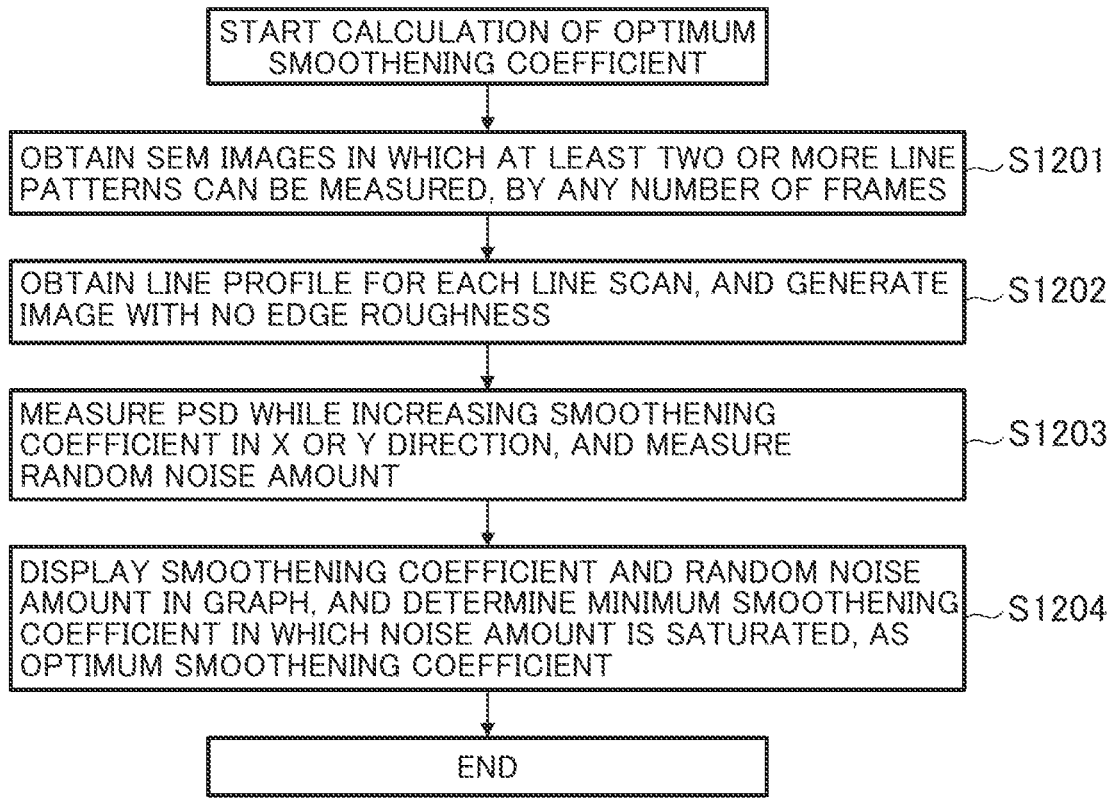
FIG. 12 is a flowchart for explaining the detail of a process for deciding an optimum smoothening coefficient.

FIG. 12 is a flowchart for explaining the detail of the process for deciding the optimum smoothening coefficient.

(i) Step 1201

The image processing section 203 obtains SEM images by any number of frames.

(ii) Step 1202

The image processing section 203 executes step 301 to step 304 in FIG. 3 with respect to each image obtained in step 1201, and generates an image with no edge roughness (see FIG. 7).

(iii) Step 1203

The FFT processing section 204 measures a PSD while increasing the smoothening coefficient in the image with no edge roughness obtained in step 1202, and calculates a random noise amount.

(iv) Step 1204

Figure 13:
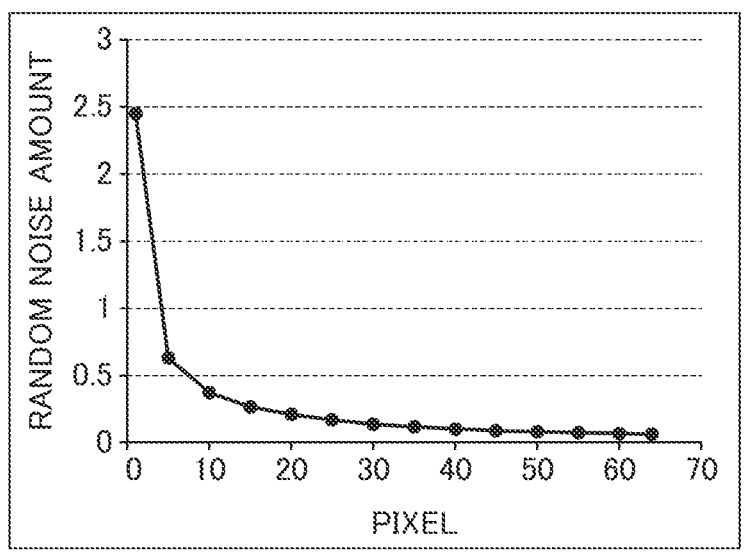
FIG. 13 is a graph in which a random noise amount calculated while increasing a smoothening coefficient in the Y direction is plotted.
Figure 14:
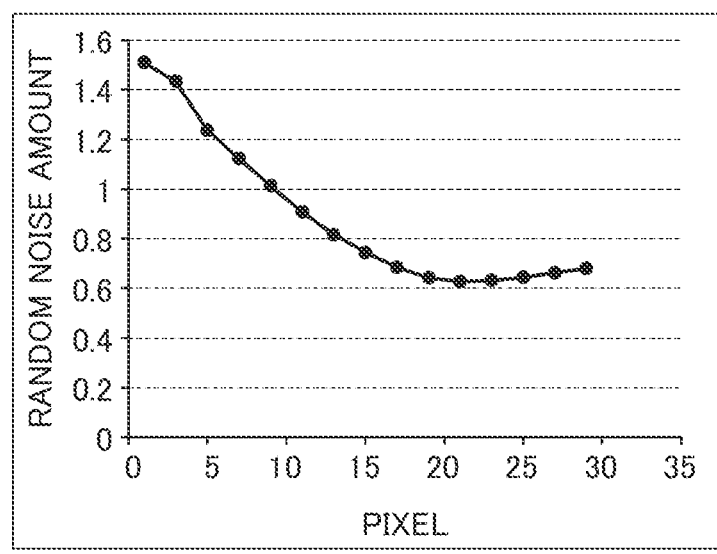
FIG. 14 is a graph in which a random noise amount calculated while increasing a smoothening coefficient in the X direction is plotted.

The waveform processing section 205 generates a graph illustrating the relationship between the smoothening coefficient and the random noise amount, and displays the graph on the image conversion unit. Then, the waveform processing section 205 determines the minimum smoothening coefficient in which the noise amount is saturated, as the optimum smoothening coefficient. Here, FIG. 13 is a graph in which the random noise amount calculated while increasing the smoothening coefficient in the Y direction is plotted. Also, FIG. 14 is a graph in which the random noise amount calculated while increasing the smoothening coefficient in the X direction is plotted. Referring to FIGS. 13 and 14, it is found that the random noise amount is substantially saturated at 20 pix in the Y direction and at 19 pix in the X direction (As in the noise saturation described above, whether or not the random noise amount is saturated can be determined on the basis of the change in the inclination in the graph.). That is, any further smoothening is meaningless. From the above result, the optimum smoothening coefficient is 20 pix in the Y direction, and is 19 pix in the X direction.

As described above, the random noise amount is plotted while changing the smoothening coefficient in the image with no roughness, so that the optimum smoothening coefficient can be decided.

<The Detection and Removal of a Noise Component Synchronized with a Power Supply Frequency>

Here, a method for detecting and removing a noise component synchronized with a power supply frequency will be described. In the CD-SEM 10, besides random noise, noise synchronized with the power supply frequency can be included. As described above, typically, the CD-SEM 10 scans the same region several times to perform the frame summation, thereby obtaining the image. When the scan is started so as to be synchronized with the power supply frequency and images are then obtained to be subjected to the summation, noise appears in the image as distortion.

Figure 15:
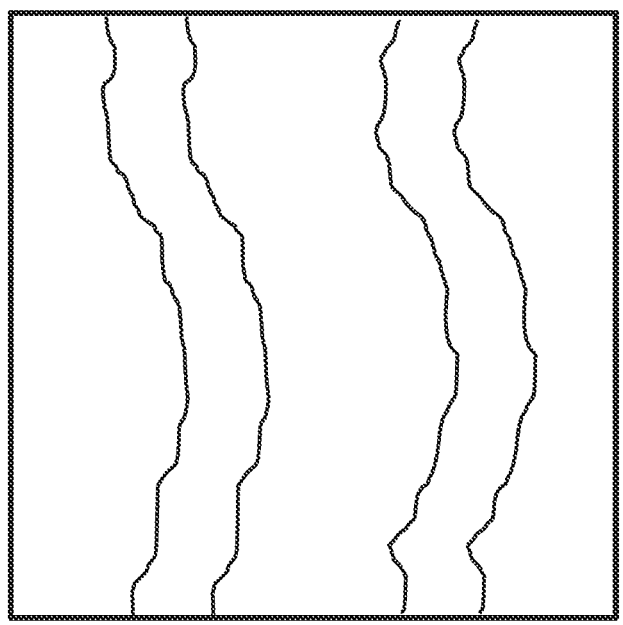
FIG. 15 is a diagram illustrating an example of an SEM image in which noise synchronized with a power supply frequency is included.
Figure 16:
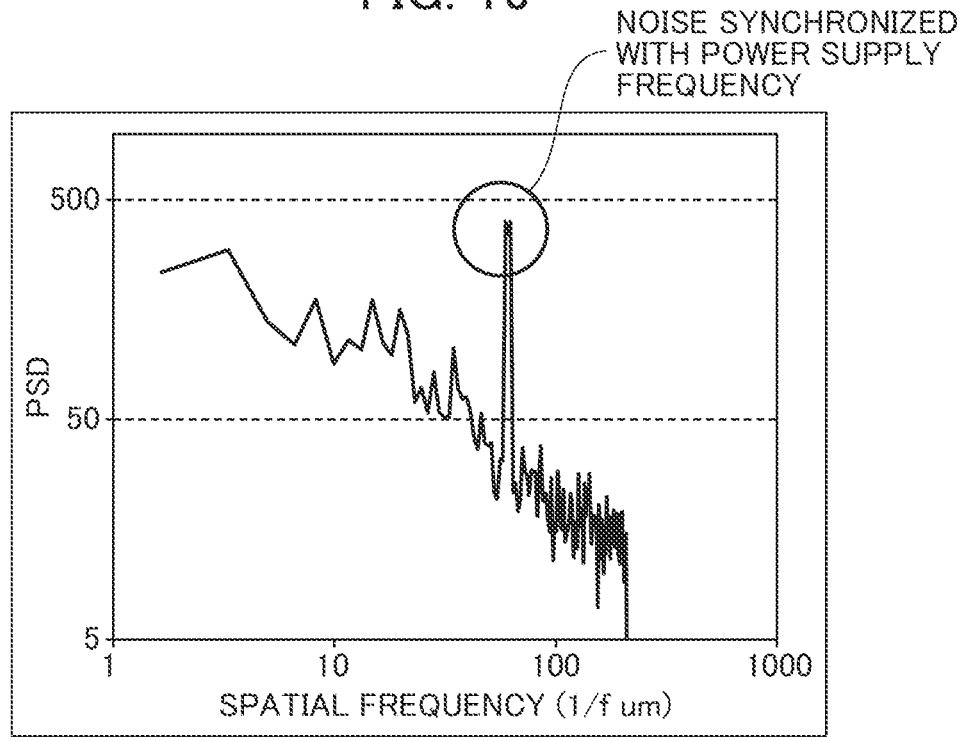
FIG. 16 is a graph illustrating the change in a measurement value with respect to a frequency when PSD measurement is performed with respect to the SEM image illustrated in FIG. 15.

FIG. 15 is a diagram illustrating an example of an SEM image in which the noise synchronized with the power supply frequency is included. From FIG. 15, it is found that the common distortion is present in a plurality of line patterns in the screen. Also, FIG. 16 is a graph (example) illustrating the change in a measurement value with respect to a frequency when the PSD measurement is performed with respect to the SEM image illustrated in FIG. 15. From FIG. 16, it is found that the noise synchronized with the power supply frequency appears in the PSD.

Accordingly, here, a process for removing only the noise component synchronized with the power supply frequency is proposed.

Figure 17:
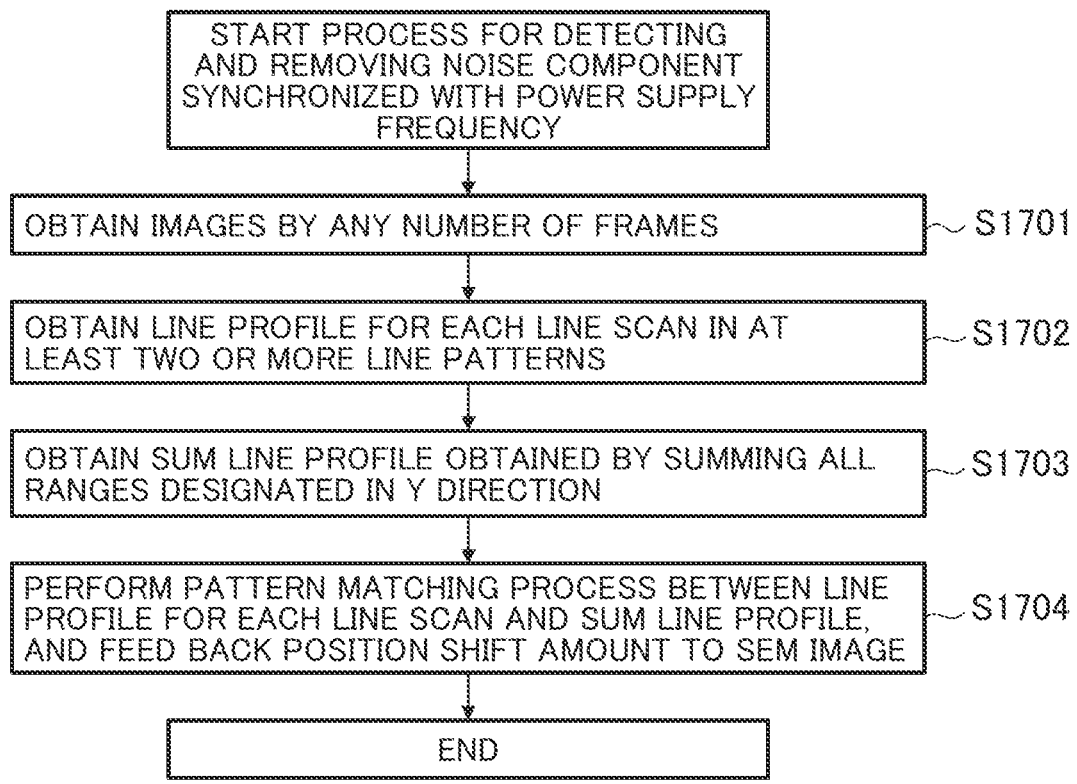
FIG. 17 is a flowchart for explaining a process for removing only a noise component synchronized with the power supply frequency.

FIG. 17 is a flowchart for explaining the process for removing only the noise component synchronized with the power supply frequency.

(i) Step 1701

The image processing section 203 obtains an SEM image so that at least two or more line patterns can be measured.

(ii) Step 1702

Figure 18:
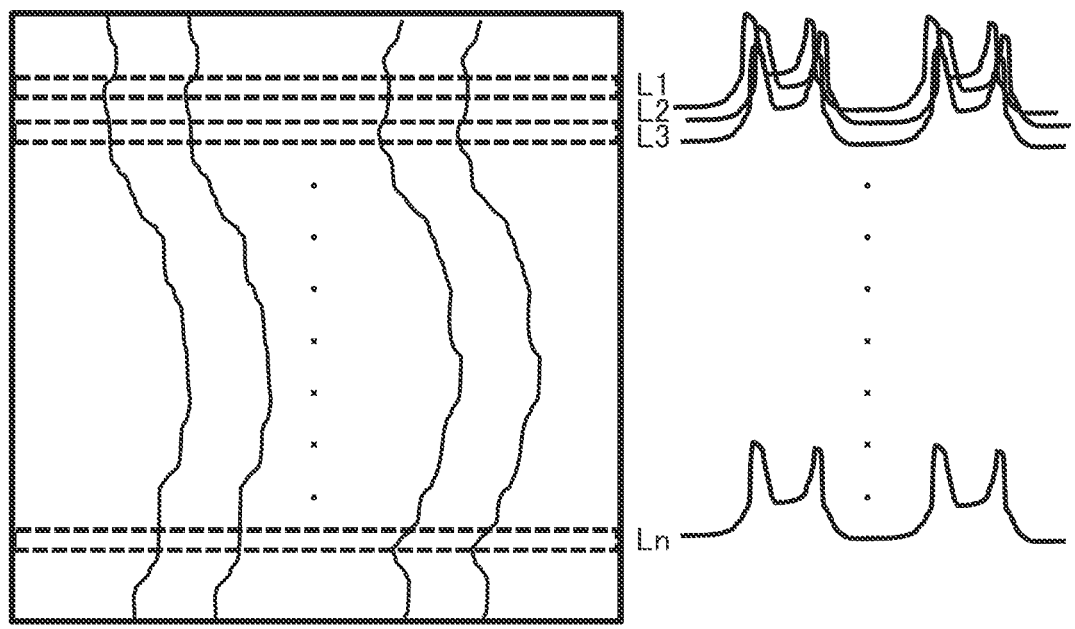
FIG. 18 is a diagram illustrating line profiles from at least two line patterns.

The image processing section 203 obtains a line profile for each line scan. However, in this case (in the process for detecting and removing the noise component synchronized with the power supply frequency), the profile is not obtained in one pattern unlike the case of the true edge roughness measurement process described above, but as illustrated in FIG. 18, the line profile is obtained from at least two or more line patterns.

(iii) Step 1703

The image processing section 203 obtains a SUM line profile obtained by summing all the ranges designated in the Y direction.

(iv) Step 1704

Figure 19:
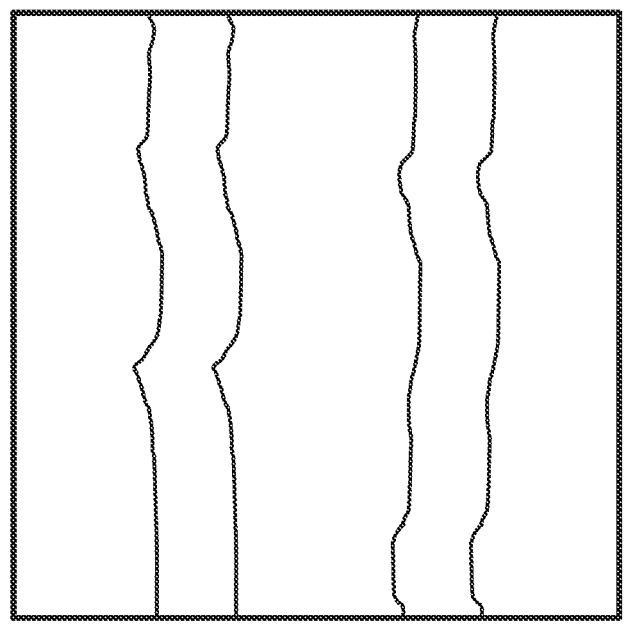
FIG. 19 is a simulation diagram illustrating the SEM image after a position shift amount is fed back to the SEM image.

The image processing section 203 performs pattern matching between the line profile for each line scan and the SUM line profile, and feeds back a position shift amount to the SEM image. At this time, the position shift amount is fed back by the same amount in the two lines. Here, FIG. 19 is a simulation diagram illustrating the SEM image after the position shift amount is fed back to the SEM image. By observing FIG. 19, it is found that the distortion due to the noise synchronized with the power supply frequency disappears, and an image in which only the edge roughness of the pattern and the random noise remain can be obtained.

As described above, according to the process for detecting/removing the noise component synchronized with the power supply frequency, the noise component synchronized with the power supply frequency can be detected and removed.

SUMMARY (i) Specific Matters of this Disclosure

Here, respective specific matters of the process for deciding the optimum number of imaging frames, the process for deciding the optimum smoothening coefficient, and the detection and removal of the noise component synchronized with the power supply frequency will be successively given.

(i-1) Specific Matter 1

A pattern measurement system that uses a signal obtained by charged particle beam scan or light irradiation with respect to a sample to measure a pattern formed on the sample, the system including a storage device that stores a program for processing the information of the pattern, and a computer that reads the program from the storage device and processes the information of the pattern, in which the computer executes a process for generating original images of the pattern having a plurality of types of the summation numbers of frames, a process for calculating a random noise amount with respect to the original image having each of the summation numbers of frames, and a process for deciding, on the basis of the relationship between the summation number of frames and the random noise amount, the optimum summation number of frames in which the summation number of frames is not excessive or is not insufficient.

(i-2) Specific Matter 2

In the pattern measurement system according to specific matter 1, in the process for calculating the random noise amount with respect to the original image having each of the summation numbers of frames, the computer generates a plurality of individual line profiles and a sum line profile with respect to the original image having each of the summation numbers of frames, divides each of the plurality of individual line profiles into two regions, performs, for each of the plurality of individual line profiles each divided into the two regions and the sum line profile, pattern matching between each of the individual line profiles and the sum line profile, executes position correction with respect to each of the plurality of individual line profiles on the basis of the result of the pattern matching, generates a correction image of the pattern from the plurality of line profiles that have been position corrected, calculates power spectrum density at the edge of the pattern in the correction image, and averages the power spectrum density to calculate the random noise component.

(i-3) Specific Matter 3

A pattern measurement system that uses a signal obtained by charged particle beam scan or light irradiation with respect to a sample to measure a pattern formed on the sample, the system including a storage device that stores a program for processing the information of the pattern, and a computer that reads the program from the storage device and processes the information of the pattern, in which the computer executes a process for obtaining the original image including a line pattern, a process for obtaining a line profile for the original image including the line pattern and generating an image having reduced edge roughness, a process for measuring power spectrum density while changing a smoothening coefficient in the image having the reduced edge roughness and calculating a random noise amount, and a process for deciding, on the basis of the relationship between the smoothening coefficient and the random noise amount, a minimum smoothening coefficient in which a noise amount is saturated.

(i-4) Specific Matter 4

In the pattern measurement system according to specific matter 3, in the process for generating the image having the reduced edge roughness, the computer generates a plurality of individual line profiles and a sum line profile of the plurality of line profiles for the original image including the at least two line patterns, divides each of the plurality of individual line profiles into two regions, executes, for each of the plurality of individual line profiles each divided into the two regions and the sum line profile, pattern matching between each of the individual line profiles and the sum line profile, executes position correction with respect to each of the plurality of individual line profiles on the basis of the result of the pattern matching, generates a correction image of the at least two line patterns from the plurality of line profiles that have been position corrected, and generates the image having the reduced edge roughness by using the correction image.

(i-5) Specific Matter 5

A pattern measurement system that uses a signal obtained by charged particle beam scan or light irradiation with respect to a sample to measure a pattern formed on the sample, the system including a storage device that stores a program for processing the information of the pattern, and a computer that reads the program from the storage device and processes the information of the pattern, in which the computer executes a process for obtaining a plurality of line profiles in a line pattern included in an original image of the sample, a process for generating a sum line profile in a predetermined direction on the basis of the plurality of line profiles, a process for performing pattern matching between each of the plurality of line profiles and the sum line profile and calculating a position shift amount, and a process for feeding back and reflecting the position shift amount to the original image.

(ii) A pattern length measurement system (also referred to as a pattern length measurement apparatus) according to this embodiment executes a process for generating a plurality of individual line profiles, a sum line profile of the plurality of line profiles (the SUM line profile described above), and an original image of a pattern on the basis of a signal obtained by irradiating the pattern with a charged particle beam, a process for dividing each of the plurality of individual line profiles into two regions (for example, two regions on the left and right sides), a process for executing, for each of the plurality of individual line profiles each divided into the two regions and the sum line profile, pattern matching between each of the individual line profiles and the sum line profile, a process for executing position correction with respect to each of the plurality of individual line profiles on the basis of the result of the pattern matching, a process for generating a correction image (see FIG. 7) of the pattern from the plurality of line profiles that have been position corrected, a process for calculating power spectrum density at the edge of the pattern in the correction image and averaging the power spectrum density to calculate a random noise component, and a process for calculating edge roughness by taking the difference between power spectrum density (PSD) at the edge of the pattern in the original image and the random noise component. In this manner, the average PSD value of all the frequencies is determined as the random noise component, so that the random noise component can be detected at high accuracy. Also, the average PSD value (random noise component) of all the frequencies is subtracted from the PSD value obtained from the original image, so that true edge roughness can be measured at high accuracy.

Note that the sum line profile is configured to have a first line template image including a first peak waveform (for example, an image in a right region), and a second line template image including a second peak waveform (for example, an image in a left region). Thus, the pattern matching with the original image can be executed at high accuracy.

(iii) A pattern length measurement system according to this embodiment executes a process for generating original images of a pattern having a plurality of types of the summation numbers of frames (for example, the summation numbers of frames for 2 frames to 32 frames) (the original image corresponding to each of the summation numbers of frames), a process for calculating a random noise amount with respect to the original image having each of the summation numbers of frames, and a process for deciding, on the basis of the relationship between the summation number of frames and the random noise amount, the optimum summation number of frames in which the summation number of frames is not excessive or is not insufficient (the optimum summation number of frames in which the summation number of frames is not excessive or is not insufficient). As described above, the process for calculating a random noise amount with respect to the original image having each of the summation numbers of frames corresponds to the process of step 301 to step 305 in FIG. 3. That is, the process for calculating the random noise amount generates a plurality of individual line profiles and a sum line profile (SUM line profile) with respect to the original image having each of the summation numbers of frames, divides each of the plurality of individual line profiles into two regions (left and right regions), performs, for each of the plurality of individual line profiles each divided into the two regions and the sum line profile, pattern matching between each of the individual line profiles and the sum line profile, executes position correction with respect to each of the plurality of individual line profiles on the basis of the result of the pattern matching, generates a correction image of the pattern from the plurality of line profiles that have been position corrected, calculates power spectrum density at the edge of the pattern in the correction image, and averages the power spectrum density to calculate a random noise component. In this manner, both of the image obtaining time and the pattern measurement can be stabilized. That is, even when the summation number of frames is excessively increased, the image obtaining time is simply increased, and even when the summation of the number of frames that is larger than the optimum summation number of frames is performed, its summation process itself is wasteful. On the other hand, when the summation number of frames is too small, the random noise is relatively large, and the measurement result is not stable. Accordingly, both of these can be performed by executing the process for calculating the optimum summation number of frames of this embodiment. Note that in the decision to the optimum summation number of frames, the graph illustrating the relationship between the summation number of frames and the random noise amount (see FIG. 11) is generated, and the summation number of frames when the change in the inclination in the graph becomes the predetermined value or less can be determined as the optimum summation number of frames.

(iv) A pattern length measurement system according to this embodiment executes a process for obtaining an original image including a line pattern, a process for obtaining a line profile for the original image including the line pattern and generating an image having reduced edge roughness, a process for measuring power spectrum density while changing a smoothening coefficient in the image having the reduced edge roughness (The image in which the edge roughness is not present at all is desirable, but may be the image having at least the edge roughness reduced as compared with the original image.) and calculating a random noise amount, and a process for deciding, on the basis of the relationship between the smoothening coefficient and the random noise amount, a minimum smoothening coefficient in which a noise amount is saturated. Thus, the optimum smoothening coefficient adaptable to the shape of the actual pattern edge (the number of pixels used in the smoothening process) can be decided. Note that in further detailed definition, the process for generating the image having the reduced edge roughness generates a plurality of individual line profiles and a sum line profile of the plurality of line profiles (SUM line profile) for the original image including the line pattern, divides each of the plurality of individual line profiles into two regions (for example, two regions on the left and right sides), performs, for each of the plurality of individual line profiles each divided into the two regions and the sum line profile, pattern matching between each of the individual line profiles and the sum line profile, executes position correction with respect to each of the plurality of individual line profiles on the basis of the result of the pattern matching, generates a correction image of the line pattern from the plurality of line profiles that have been position corrected, and generates the image having the reduced edge roughness by using the correction image. This corresponds to step 301 to step 304 in FIG. 3.

(v) A pattern length measurement system according to this embodiment executes a process for obtaining a plurality of line profiles in at least two line patterns included in an original image, a process for generating a sum line profile (SUM line profile) in a predetermined direction (for example, the Y direction) on the basis of the plurality of line profiles, a process for performing pattern matching between each of the plurality of line profiles and the sum line profile and calculating a position shift amount, and a process for feeding back and reflecting the position shift amount to the original image. In this manner, the noise component synchronized with the power supply frequency can be detected and removed. Note that here, the process for detecting and removing the power supply frequency noise is executed with respect to the image including at least two line patterns, because when the noise synchronized with the power supply frequency is present, the pattern that is dull in the same direction in the two line patterns is detected.

(vi) The function of the embodiment according to this disclosure can be realized also by the program code of software. In this case, a storage medium that records the program code is provided to the system or the apparatus, and the computer of the system or the apparatus (or the CPU or the MPU) reads the program code stored in the storage medium. In this case, the program code itself read from the storage medium realizes the function of the above embodiment, and the program code itself and the storage medium that records the program code configure this disclosure. As the storage medium for supplying such the program code, for example, a flexible disk, a CD-ROM, a DVD-ROM, a hard disk, an optical disk, a magneto-optical disk, a CD-R, a magnetic tape, a nonvolatile memory card, a ROM, and the like are used.

Also, the OS operated on the computer (operating system) and the like may perform part or all of the actual process on the basis of the instruction of the program code, and the function of the above embodiment may be realized by the process. Further, after the program code read from the storage medium is written to the memory on the computer, the CPU or the like of the computer may perform part or all of the actual process on the basis of the instruction of the program code, and the function of the above embodiment may be realized by the process.

Further, by delivering the program code of the software that realizes the function of the embodiment via the network, the program code may be stored in storage means, such as the hard disk or the memory of the system or the apparatus, or in the storage medium, such as a CD-RW, a CD-R, or the like, and the computer of the system or the apparatus (or the CPU or the MPU) may read and execute the program code stored in the storage means or the storage medium in use.

Last, the process and technique described here can be essentially implemented also by any suitable combinations of the components without being related to any particular device. Further, various types of general-purpose devices can be used according to the teaching described here. To execute the steps of the method described here, there is also a case where configuring an exclusive device is effective. Also, various inventions can be formed by appropriate combinations of a plurality of components disclosed in the embodiment. For example, some components may be deleted from all the components illustrated in the embodiment, and further, different components may be appropriately combined. This disclosure has been described in relation to the specific examples, but these are for the description, not for the limitation in all viewpoints. Those skilled in the art will understand that there are a large number of combinations of hardware, software, and firmware suitable for performing this disclosure. For example, the described software can be implemented by a program or a script language in a wide range, such as assembler, C/C++, perl, Shell, PHP, and Java (trademark).

Further, in the above embodiment, the control lines and the information lines that are considered to be necessary for the description are represented, and all the control lines and information lines are not necessarily represented for the product. All the configurations may be mutually connected.

LIST OF REFERENCE SIGNS

10 CD-SEM
101 Electron gun
102 Primary beam
103 Condenser lens
104 Diaphragm
105 Objective lens
106 Sample
107 Discharge electron
108 Detector
109 Image conversion unit
202 Pattern measurement unit
203 Image processing section
204 FFT processing section
205 Waveform processing section
206 Measurement processing section

The invention claimed is:

1. A pattern measurement system that uses a signal obtained by charged particle beam scan or light irradiation with respect to a sample to measure a pattern formed on the sample, the system comprising:
   a storage device that stores a program for processing the information of the pattern; and
   a computer that reads the program from the storage device and processes the information of the pattern,
   wherein the computer executes:
   a process for generating, based on the signal obtained from the pattern, a plurality of individual line profiles, a sum line profile of the plurality of line profiles, and an original image of the pattern, wherein each of the individual line profiles is created from a line scan of the original image;
   a process for dividing each of the plurality of individual line profiles into two regions;
   a process for executing, for each of the plurality of individual line profiles each divided into the two regions and the sum line profile, pattern matching between each of the individual line profiles and the sum line profile to obtain a position shift amount between the sum line profile and each of the individual line profiles;
   a process for executing position correction with respect to each of the plurality of individual line profiles based on the position shift amounts;
   a process for generating a correction image of the pattern from the plurality of line profiles that have been position corrected;
   a process for calculating power spectrum density at the edge of the pattern in the correction image and averaging the power spectrum density to calculate a random noise component;
   a process for calculating edge roughness by taking the difference between power spectrum density at the edge of the pattern in the original image and the random noise component;
   a process for generating original images of the pattern having a plurality of types of summation numbers of frames;

a process for calculating a random noise amount with respect to the original image having each of the summation numbers of frames; and a process for deciding an optimum summation number of frames based on a relationship between the summation number of frames and the random noise amount, wherein the optimum summation number of frames equals a predetermined ratio of the random noise amount to the summation number of frames.

2. The pattern measurement system according to claim 1, wherein the computer divides each of the plurality of individual line profiles into two regions on the left and right sides.

3. The pattern measurement system according to claim 1, wherein the sum line profile has a first line template image including a first peak waveform, and a second line template image including a second peak waveform.

4. The pattern measurement system according to claim 1, wherein in the process for calculating the random noise amount with respect to the original image having each of the summation numbers of frames, the computer generates the plurality of individual line profiles and the sum line profile with respect to the original image having each of the summation numbers of frames, divides each of the plurality of individual line profiles into two regions, performs, for each of the plurality of individual line profiles each divided into the two regions and the sum line profile, pattern matching between each of the individual line profiles and the sum line profile, executes position correction with respect to each of the plurality of individual line profiles on the basis of the result of the pattern matching, generates a correction image of the pattern from the plurality of line profiles that have been position corrected, calculates power spectrum density at the edge of the pattern in the correction image, and averages the power spectrum density to calculate the random noise component.

5. The pattern measurement system according to claim 1, wherein the computer generates a graph illustrating the relationship between the summation number of frames and the random noise amount, and decides the optimum summation number of frames based on a value of a change in an inclination in the graph.

6. The pattern measurement system according to claim 1, wherein the computer executes:
a process for obtaining a line profile for each line and generating an image having reduced edge roughness;
a process for measuring power spectrum density while changing a smoothening coefficient in the image having the reduced edge roughness and calculating a random noise amount; and
a process for deciding, on the basis of the relationship between the smoothening coefficient and the random noise amount, a minimum smoothening coefficient in which a noise amount is saturated.

7. The pattern measurement system according to claim 6, wherein in the process for generating the image having the reduced edge roughness, the computer generates a plurality of individual line profiles and a sum line profile of the plurality of line profiles for an original image including the line pattern, divides each of the plurality of individual line profiles into two regions, executes, for each of the plurality of individual line profiles each divided into the two regions and the sum line profile, pattern matching between each of the individual line profiles and the sum line profile, executes position correction with respect to each of the plurality of individual line profiles on the basis of the result of the pattern matching, generates a correction image of the line pattern from the plurality of line profiles that have been position corrected, and generates the image having the reduced edge roughness by using the correction image.

8. The pattern measurement system according to claim 1, wherein the computer executes:
a process for obtaining the plurality of line profiles in at least two line patterns included in the original image;
a process for generating the sum line profile in a predetermined direction on the basis of the plurality of line profiles;
a process for performing pattern matching between each of the plurality of line profiles and the sum line profile and calculating a position shift amount; and
a process for feeding back and reflecting the position shift amount to the original image.

9. A pattern measurement method that uses a signal obtained by charged particle beam scan or light irradiation with respect to a sample to measure a pattern formed on the sample, the method comprising:
generating, by a computer that reads a program from a storage device that stores the program for processing the information of the pattern and processes the information of the pattern, based on the signal obtained from the pattern, a plurality of individual line profiles, a sum line profile of the plurality of line profiles, and an original image of the pattern, wherein each of the individual line profiles is created from a line scan of the original image;
dividing, by the computer, each of the plurality of individual line profiles into two regions;
executing, by the computer, for each of the plurality of individual line profiles each divided into the two regions and the sum line profile, pattern matching between each of the individual line profiles and the sum line profile;
executing, by the computer, position correction with respect to each of the plurality of individual line profiles on the basis of the result of the pattern matching;
generating, by the computer, a correction image of the pattern from the plurality of line profiles that have been position corrected;
calculating, by the computer, power spectrum density at the edge of the pattern in the correction image and averaging, by the computer, the power spectrum density to calculate a random noise component; and
calculating, by the computer, edge roughness by taking the difference between power spectrum density at the edge of the pattern in the original image and the random noise component;
generating, by the computer, original images of the pattern having a plurality of types of summation numbers of frames;
calculating, by the computer, a random noise amount with respect to the original image having each of the summation numbers of frames; and
deciding, by the computer, an optimum summation number of frames based on a relationship between the summation number of frames and the random noise amount, wherein the optimum summation number of frames equals a predetermined ratio of the random noise amount to the summation number of frames.

10. The pattern measurement method according to claim 9, further comprising:
   obtaining, by the computer, the original image;
   obtaining, by the computer, a line profile for each line for the original image and generating, by the computer, an image having reduced edge roughness;
   measuring, by the computer, power spectrum density while changing a smoothening coefficient in the image having the reduced edge roughness and calculating, by the computer, a random noise amount; and
   deciding, by the computer, on the basis of the relationship between the smoothening coefficient and the random noise amount, a minimum smoothening coefficient in which a noise amount is saturated.

11. The pattern measurement method according to claim 9,
   obtaining, by the computer, the plurality of line profiles in at least two line patterns included in the original image;
   generating, by the computer, the sum line profile in a predetermined direction on the basis of the plurality of line profiles;
   performing, by the computer, pattern matching between each of the plurality of line profiles and the sum line profile and calculating, by the computer, a position shift amount; and
   feeding back and reflecting, by the computer, the position shift amount to the original image.

12. A non-transitory computer-readable medium storing a program for causing a computer to execute a pattern measurement process that uses a signal obtained by charged particle beam scan or light irradiation with respect to a sample to measure a pattern formed on the sample, the program for causing the computer to execute:
   a process by which the computer that processes the information of the pattern generates, based on the signal obtained from the pattern, a plurality of individual line profiles, a sum line profile of the plurality of line profiles, and an original image of the pattern, wherein each of the individual line profiles is created from a line scan of the original image;
   a process by which the computer divides each of the plurality of individual line profiles into two regions;
   a process by which the computer executes, for each of the plurality of individual line profiles each divided into the two regions and the sum line profile, pattern matching between each of the individual line profiles and the sum line profile;
   a process by which the computer executes position correction with respect to each of the plurality of individual line profiles on the basis of the result of the pattern matching;
   a process by which the computer generates a correction image of the pattern from the plurality of line profiles that have been position corrected;
   a process by which the computer calculates power spectrum density at the edge of the pattern in the correction image and averaging, by the computer, the power spectrum density to calculate a random noise component;
   a process by which the computer calculates edge roughness by taking the difference between power spectrum density at the edge of the pattern in the original image and the random noise component;
   a process for generating original images of the pattern having a plurality of types of summation numbers of frames;
   a process for calculating a random noise amount with respect to the original image having each of the summation numbers of frames; and
   a process for deciding an optimum summation number of frames based on a relationship between the summation number of frames and the random noise amount, wherein the optimum summation number of frames equals a predetermined ratio of the random noise amount to the summation number of frames.

* * * * *